(12) United States Patent
Chi-Wei et al.

(10) Patent No.: US 7,426,112 B2
(45) Date of Patent: Sep. 16, 2008

(54) HEAT DISSIPATING MODULE

(75) Inventors: Tien Chi-Wei, Taipei (TW); Cheng Chau-Wen, Taipei (TW)

(73) Assignee: Compal Electronics, Inc, Taipei (TW)

( * ) Notice: Subject to any disclaimer, the term of this patent is extended or adjusted under 35 U.S.C. 154(b) by 65 days.

(21) Appl. No.: 11/705,937

(22) Filed: Feb. 13, 2007

(65) Prior Publication Data
US 2007/0242437 A1 Oct. 18, 2007

(30) Foreign Application Priority Data
Apr. 14, 2006 (TW) ............................... 95113344 A

(51) Int. Cl.
*H05K 7/20* (2006.01)
(52) U.S. Cl. .................. 361/700; 361/699; 361/704; 361/719; 257/715; 257/718; 257/719; 257/727; 174/15.2; 165/80.4; 165/104.26
(58) Field of Classification Search ........................ None
See application file for complete search history.

(56) References Cited

U.S. PATENT DOCUMENTS

| 6,301,107 B1 * | 10/2001 | Lev et al. ..................... 361/687 |
| 6,469,893 B1 * | 10/2002 | Frutschy et al. ............. 361/700 |
| 6,781,835 B2 * | 8/2004 | Hashimoto et al. .......... 361/697 |
| 7,327,574 B2 * | 2/2008 | Frank et al. .................. 361/711 |
| 2003/0106670 A1 * | 6/2003 | Lee et al. ..................... 165/80.3 |
| 2003/0117773 A1 * | 6/2003 | Cheng et al. ................. 361/700 |
| 2004/0001316 A1 * | 1/2004 | Kamikawa et al. .......... 361/700 |

* cited by examiner

*Primary Examiner*—Boris L Chervinsky
(74) *Attorney, Agent, or Firm*—Ming Chow; Sinorica, LLC

(57) ABSTRACT

A heat dissipating module includes a releasing member, a heat pipe, which has a first end connected to the releasing member and a second end attached to the top surface of a thermal chip on a circuit board, and a fastening member, which has a protruded arch portion that defines an arch chamber that accommodates the second end of the heat pipe, two press portions respectively extended from two opposite lateral sides of the protruded arch portion and pressed on the top surface of the thermal chip, and a plurality of hook portions respectively extended from the press portions and hooked on the bottom edge of the circuit board.

7 Claims, 4 Drawing Sheets

HEAT DISSIPATING MODULE

BACKGROUND OF THE INVENTION

1. Field of the Invention

The present invention relates to a heat dissipating module for dissipating heat from a thermal chip on a circuit board and more particularly, to such a heat dissipating module, which uses a fastening member to hold down a heat pipe on a thermal chip at a circuit board for quick dissipation of heat from the thermal chip.

2. Description of the Related Art

Thermal chips are commonly used in electronic devices. For example, a notebook computer uses a CPU as the control center. Following functional enhancement and acceleration of operation speed, an advanced thermal chip releases much thermal energy during operation.

Because the thermal chip of an electronic device is mounted inside the housing. During operation of an electronic device, heat must be quickly dissipated from the thermal chip of the electronic device. Accumulation of heat inside the housing will soon affect normal functioning of the thermal chip. Various heat dissipating modules have been created for this purpose.

Conventionally, screws are used to affix a heat dissipating module to mounting posts on a circuit board. A prior art heat dissipating module is known comprising a thermal plate for mounting on the top surface of a thermal chip, for example, CPU, a heat pipe connected with its one end to the thermal plate, a heat sink connected to the other end of the heat pipe, and a fan installed in the heat sink.

The installation of the aforesaid conventional heat dissipating module is complicated. providing mounting posts on a circuit board for the mounting of a heat dissipating module greatly increases the cost and complicates the installation.

SUMMARY OF THE INVENTION

The present invention has been accomplished under the circumstances in view. It is therefore the main object of the present invention to provide a heat dissipating module, which is easy to install.

It is another object of the present invention to provide a heat dissipating module, which has a simple structure and is inexpensive to manufacture.

To achieve these and other objects of the present invention, the heat dissipating module is installed in a circuit board to dissipate heat from a thermal chip on the circuit board, comprising a releasing member, a heat pipe, and a fastening member. The heat pipe is a hollow pipe having a first end connected to the releasing member and a second end bonded to a top surface of the thermal chip for transferring heat energy from the thermal chip to the releasing member. The fastening member has an upwardly protruded arch portion on the middle, an arch chamber defined under the upwardly protruded arch portion for accommodating the second end of the heat pipe, two press portions respectively outwardly extended from two opposite lateral sides of the upwardly protruded arch portion and pressed on the top surface of the thermal chip, and a plurality of hook portion respectively extended from the press portions for fastening to the circuit board.

The circuit board may be made having a plurality of through holes for receiving the hook portions of the fastening member.

Alternatively, the circuit board can be made having a plurality of retaining lugs formed integral with a part thereof and defining with a top surface thereof a respective gap for receiving the hook portions of the fastening member.

Further, the fastening member has a plurality of bridge portions respectively connected between the press portions and the hook portions, and a plurality of oblique connecting portions respectively upwardly extending from the press portions to the bridge portions.

Further, the fastening member can be made having two hook portions at each of the two opposite lateral sides.

Further, the second end of the heat pipe is bonded to the top surface of the thermal chip with a thermal adhesive.

Further, each hook portion of the fastening member extends obliquely outwards

DETAILED DESCRIPTION OF THE PREFERRED EMBODIMENT

Figure 1:
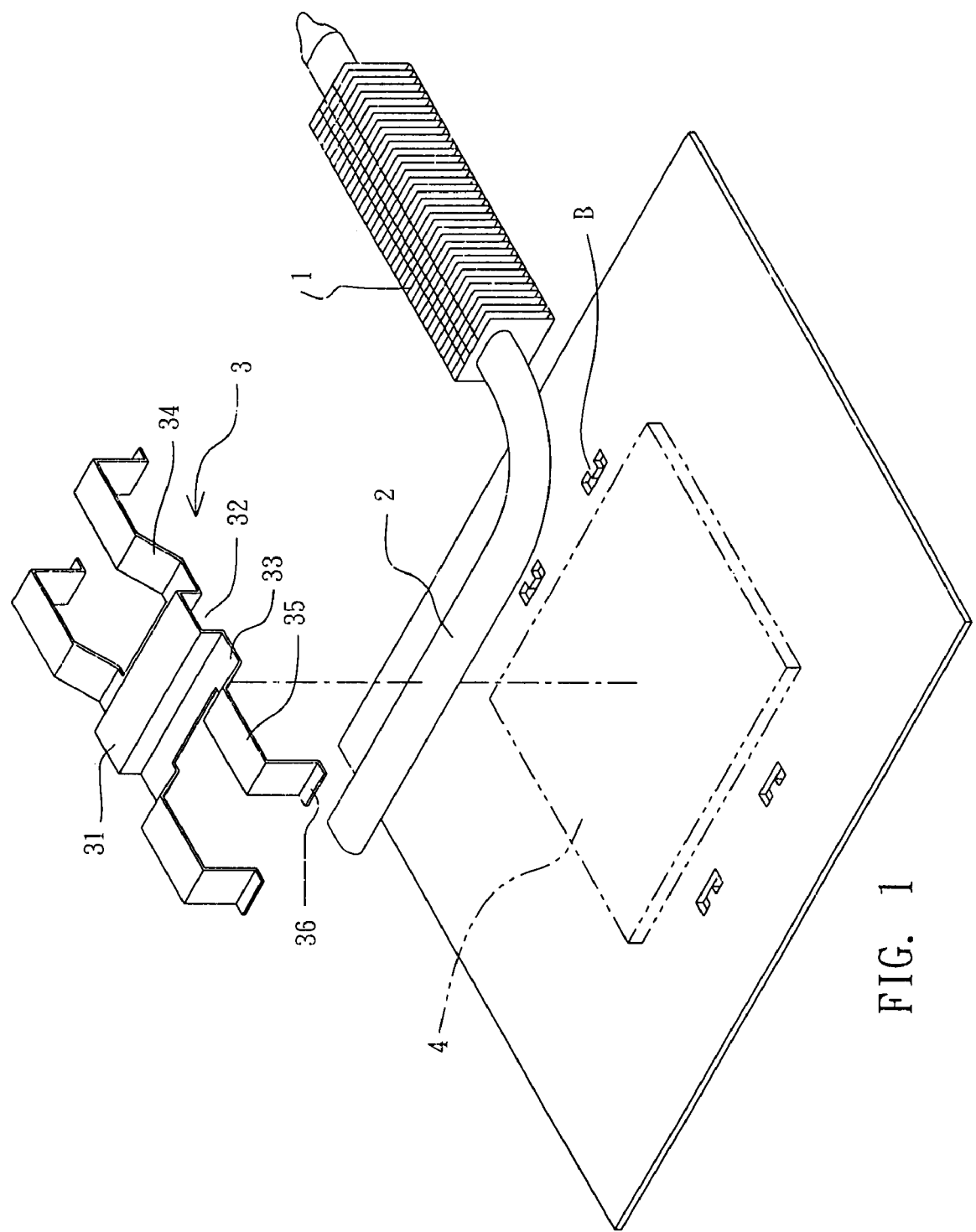
FIG. 1 is an exploded view of a heat dissipating module according to a first embodiment of the present invention.
Figure 2:
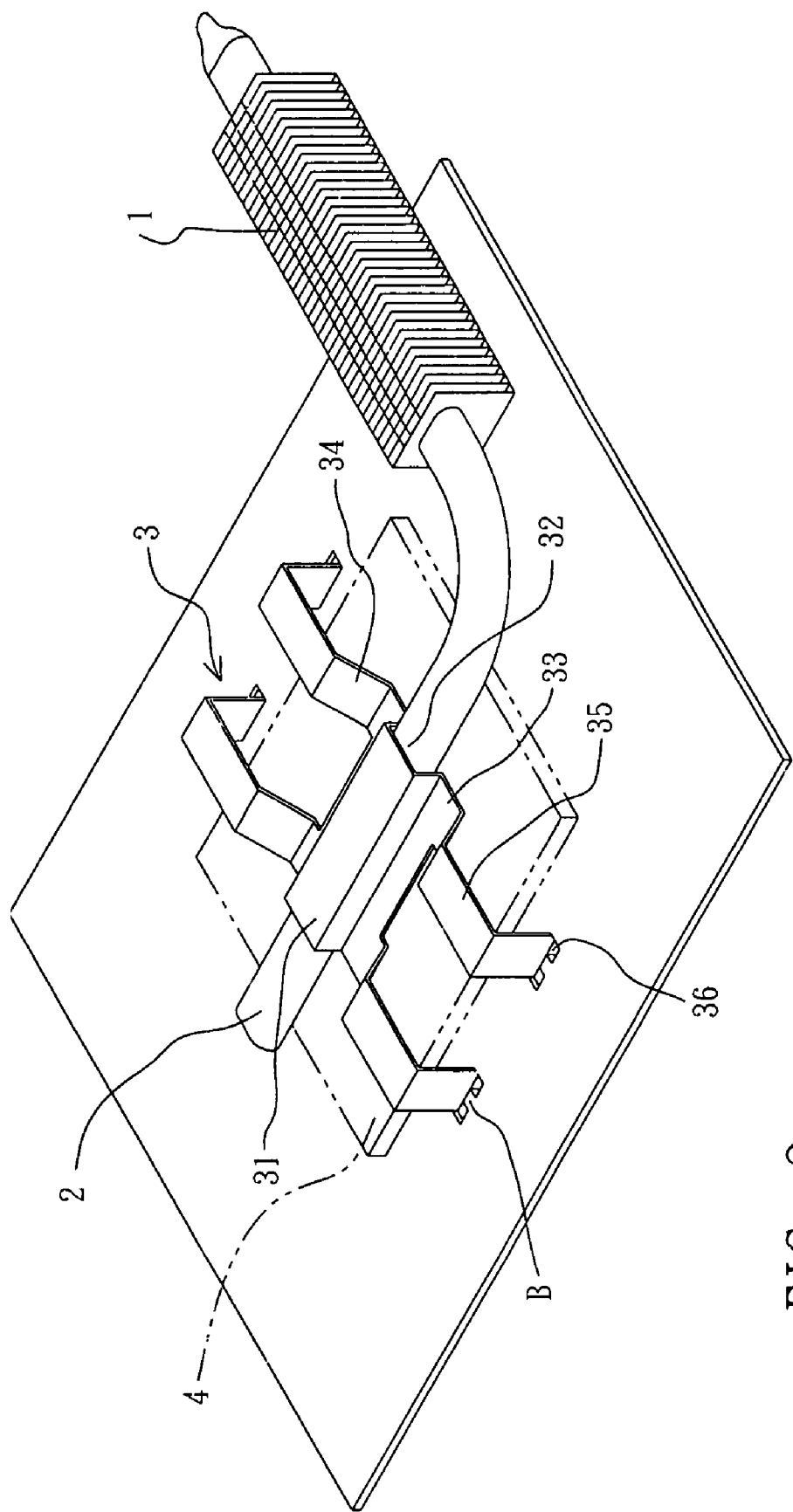
FIG. 2 is an installed view of the heat dissipating module according to the first embodiment of the present invention.

Referring to FIGS. 1 and 2, a heat dissipating module in accordance with the present invention is shown comprised of releasing member 1, a heat pipe 2, and a fastening member 3.

The releasing member 1 is a thermal energy releasing terminal, for example, a heat sink formed of a plurality of radiating fins that are arranged in parallel. Because the releasing member 1 is of the known art, no further detailed description in this regard is necessary.

The heat pipe 2 is a thermal conductive metal round, flat, or oval pipe. According to this embodiment, the heat pipe 2 is a copper pipe. A lining member or working fluid may be provided inside the heat pipe 2. Further, the heat pipe 2 has one end fastened to the releasing member 1.

The fastening member 3 may be directly stamped from a metal sheet in integrity or molded from polymers, having an upwardly protruded arch portion 31 on the middle that defines an arch chamber 32 thereunder, two press portions 33 respectively outwardly extended from two opposite lateral sides of the protruded arch portion 31, a plurality of hook portions 36 symmetrically disposed at two sides, a plurality of flat bridge portions 35 respectively connected between the press portions 33 and the hook portions 36, and a plurality of connecting portions 34 respectively obliquely connected between the flat bridge portions 35 and the press portions 33. Each hook portion 36 extends obliquely outwards. Alternatively, the hook portion 36 may extend obliquely inwards.

Figure 3:
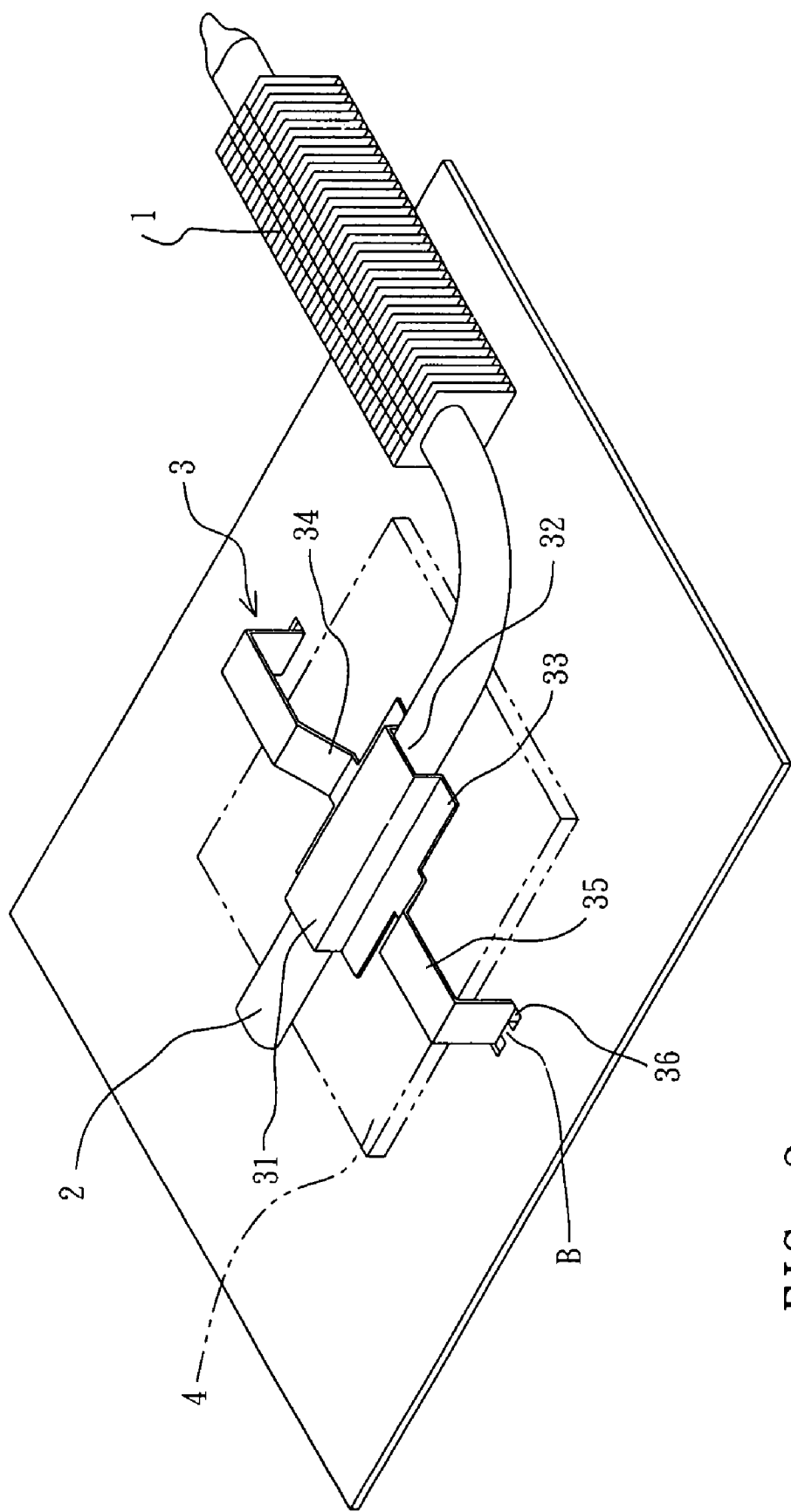
FIG. 3 is an installed view of a heat dissipating module according to a second embodiment of the present invention.

According to the first embodiment of the present invention as shown in FIG. 1 and FIG. 2, the fastening member 3 has at each of the two opposite lateral sides thereof two connecting portions 34, two flat bridge portions 35, and two hook portions 36. According to the second embodiment of the present invention as shown in FIG. 3, the fastening member 3 has at each of the two opposite lateral sides thereof one connecting portion 34, one flat bridge portion 35, and one hook portion 36.

Referring to FIGS. 2 and 3 again, the heat pipe 2 is received in the protruded arch portion 31 under the arch chamber 32 of the fastening member 3 and bonded with its bottom surface to the top surface of a thermal chip 4 with a thermal adhesive A, and the hook portions 36 of the fastening member 3 are inserted through respective mounting through holes B on the circuit board carrying the thermal chip 4 and hooked on the bottom edge of the circuit board. During operation of the thermal chip 4, heat energy is transferred from the thermal chip 4 through the heat pipe 2 to the releasing member 1 for further dissipation into the outside open air.

Figure 4:
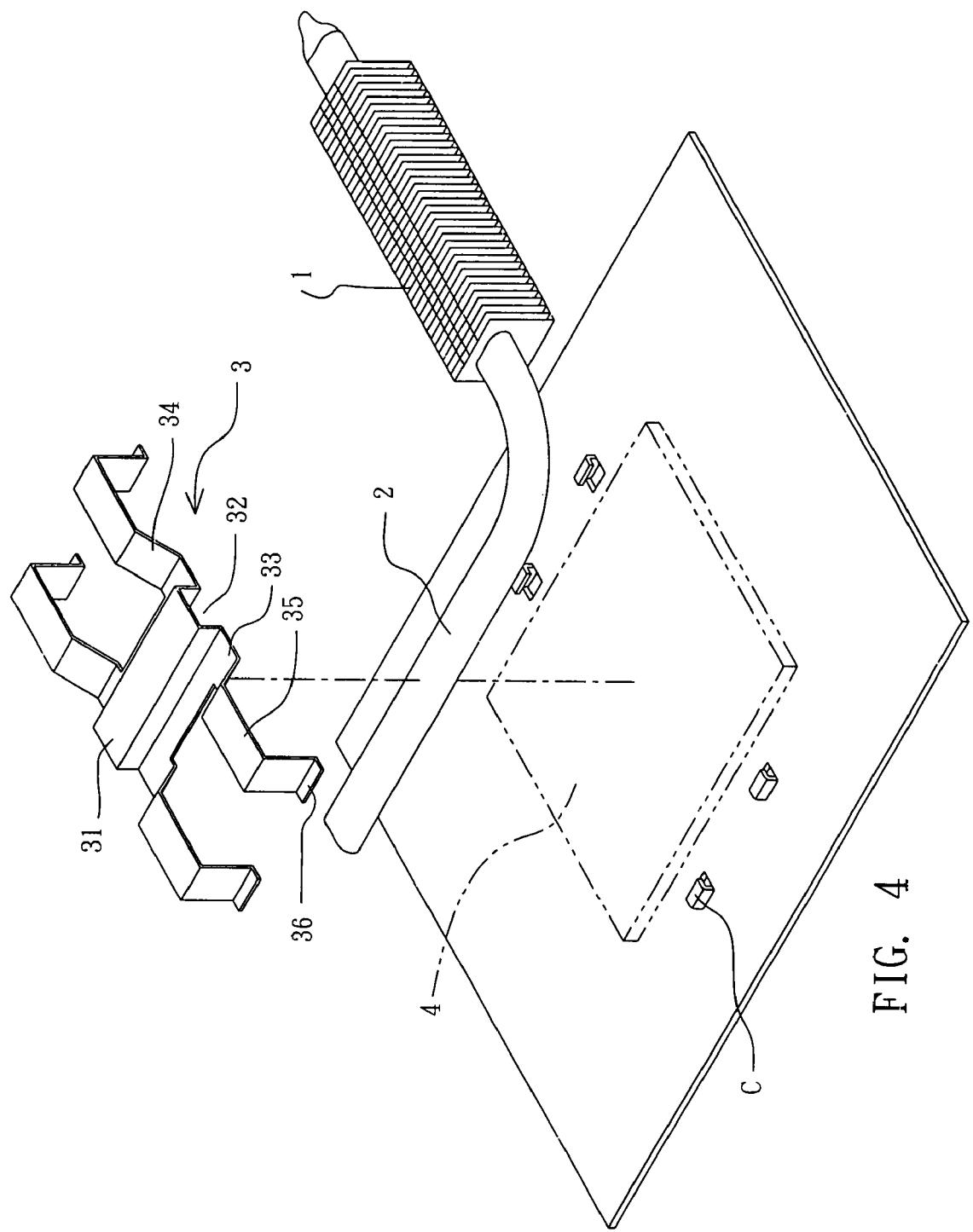
FIG. 4 is an exploded view of a heat dissipating module according to a third embodiment of the present invention.

FIG. 4 is an exploded view of a heat dissipating module according to a third embodiment of the present invention. According to this embodiment, the circuit board has retaining lugs C for securing the hook portions 36 of the fastening member 3. The retaining lugs C each define with the top surface of the circuit board a gap. By means of a sliding action of the fastening member 3, he hook portions 36 of the fastening member 3 are respectively forced into the gap between each retaining lug C and the top surface of the circuit board and hooked up with the retaining lugs C.

According to the present invention, the heat dissipating module can easily be installed by hand without any tools. Further, the heat dissipating module has the features of simple structure and low manufacturing cost.

A prototype of heat dissipating module has been constructed with the features of FIGS. 1~4. The heat dissipating module functions smoothly to provide all of the features disclosed earlier.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A heat dissipating module installed in a circuit board to dissipate heat from a thermal chip on said circuit board, the heat dissipating module comprising:
    a releasing member for dissipation of heat;
    a heat pipe, said heat pipe having a first end connected to said releasing member and a second end bonded to a top surface of said thermal chip for transferring heat energy from said thermal chip to said releasing member; and
    a fastening member for fastening to said circuit board to secure the second end of said heat pipe to said thermal chip, said fastening member comprising an upwardly protruded arch portion on a middle part thereof, an arch chamber defined under said upwardly protruded arch portion for accommodating the second end of said heat pipe, two press portions respectively outwardly extended from two opposite lateral sides of said upwardly protruded arch portion and pressed on said thermal chip, and a plurality of hook portion respectively extended from said press portions for fastening to said circuit board.

2. The heat dissipating module as claimed in claim 1, wherein said circuit board has a plurality of through holes for receiving the hook portions of said fastening member.

3. The heat dissipating module as claimed in claim 1, wherein said circuit board has a plurality of retaining lugs formed integral with a part thereof and defining with a top surface thereof a respective gap for receiving the hook portions of said fastening member.

4. The heat dissipating module as claimed in claim 1, wherein said fastening member has a plurality of bridge portions respectively connected between said press portions and said hook portions, and a plurality of oblique connecting portions respectively upwardly extending from said press portions to said bridge portions.

5. The heat dissipating module as claimed in claim 1, wherein said fastening member has two hook portions at each of the two opposite lateral sides.

6. The heat dissipating module as claimed in claim 1, wherein the second end of said heat pipe is bonded to the top surface of said thermal chip with a thermal adhesive.

7. The heat dissipating module as claimed in claim 1, each hook portion of said fastening member extends obliquely outwards.

* * * * *